US012591021B2

(12) United States Patent
Hanaoka

(10) Patent No.: US 12,591,021 B2
(45) Date of Patent: Mar. 31, 2026

(54) SHORT-CIRCUIT DETERMINATION CIRCUIT

(71) Applicant: YAZAKI CORPORATION, Tokyo (JP)

(72) Inventor: Hiromichi Hanaoka, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 120 days.

(21) Appl. No.: 18/639,939

(22) Filed: Apr. 18, 2024

(65) Prior Publication Data

US 2024/0361402 A1  Oct. 31, 2024

(30) Foreign Application Priority Data

Apr. 28, 2023  (JP) ................................. 2023-074224

(51) Int. Cl.
| | |
|---|---|
| *G01R 31/52* | (2020.01) |
| *G01R 31/40* | (2020.01) |
| *H02J 7/62* | (2026.01) |
| *H02J 7/80* | (2026.01) |

(52) U.S. Cl.
CPC ............. *G01R 31/52* (2020.01); *G01R 31/40* (2013.01); *H02J 7/62* (2026.01); *H02J 7/80* (2026.01)

(58) Field of Classification Search
CPC ........ G01R 31/00; G01R 31/40; G01R 31/42; G01R 31/50; G01R 31/52; H02J 7/00; H02J 7/0029; H02J 7/00304; H02J 7/0031; H02J 7/0047; H02J 7/0068; H02J 7/007; H02J 7/00712; H02J 7/00714; H02J 7/007182; H02J 7/34; H02J 7/342; Y02E 60/00; Y02E 60/10
USPC ........ 324/500, 537, 539, 541, 543, 544, 555
See application file for complete search history.

(56) References Cited

FOREIGN PATENT DOCUMENTS

| | | | | |
|---|---|---|---|---|
| CN | 108886266 A | * 11/2018 | ......... | B60R 16/0238 |
| CN | 117117800 A | * 11/2023 | ............. | H02J 7/262 |
| CN | 118432014 A | * 8/2024 | ............... | H02H 3/10 |
| JP | 5074648 B2 | * 11/2012 | ......... | G01R 31/3842 |
| JP | 2017-28971 A | 2/2017 | | |
| JP | 2020162244 A | * 10/2020 | ............. | G01R 31/50 |

* cited by examiner

*Primary Examiner* — Hoai-An D. Nguyen
(74) *Attorney, Agent, or Firm* — KENEALY VAIDYA LLP

(57) ABSTRACT

A short-circuit determination circuit includes a current detection unit, a voltage detection unit, and a short-circuit determination unit. The current detection unit detects the current flowing in a power circuit. The voltage detection unit detects the voltage applied to the power circuit. The short-circuit determination unit determines a short circuit in the power circuit on the basis of the difference between a detection value of the current detected by the current detection unit and a detection value of the voltage detected by the voltage detection unit.

5 Claims, 5 Drawing Sheets

SHORT-CIRCUIT DETERMINATION CIRCUIT

CROSS-REFERENCE TO RELATED APPLICATION(S)

The present application claims priority to and incorporates by reference the entire contents of Japanese Patent Application No. 2023-074224 filed in Japan on Apr. 28, 2023.

BACKGROUND OF THE INVENTION

1. Field of the Invention

The present invention relates to a short-circuit determination circuit.

2. Description of the Related Art

Conventionally, for example, Japanese Patent Application Laid-open No. 2017-028971A describes a power supply device capable of interrupting bidirectional current at high speed. This power supply device includes a power converter that converts the power of a power supply and outputs to a load, a switch connected between the power supply and the power converter, a first rectifier circuit and a second rectifier circuit connected to a current path flowing from the power supply to the power converter through the switch, and a switching circuit connected in parallel to at least one rectifier circuit of the first rectifier circuit and the second rectifier circuit. The first rectifier circuit and the second rectifier circuit are circuits that conduct current only in a forward direction, and are connected in series to the current path with their forward directions opposite to each other.

By the way, the power supply device described above in Japanese Patent Application Laid-open No. 2017-028971A interrupts bidirectional current at high speed by the first rectifier circuit and the second rectifier circuit by turning off the switching circuit in an emergency, and one example of this emergency is a short circuit. The power supply device has been demanded to determine this short circuit quickly and accurately.

SUMMARY OF THE INVENTION

The present invention has been made in view of the above, and an object is to provide a short-circuit determination circuit capable of properly determining a short circuit.

In order to achieve the above mentioned object, a short-circuit determination circuit according to one aspect of the present invention includes a current detection unit that detects current flowing in a power circuit; a voltage detection unit that detects voltage applied to the power circuit; and a short-circuit determination unit that determines a short circuit in the power circuit, based on a difference between a detection value of the current detected by the current detection unit and a detection value of the voltage detected by the voltage detection unit.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

A mode (embodiment) for carrying out the present invention will be described in detail with reference to the drawings. The present invention is not limited by the content described in the following embodiment. The components described below include those that can be readily conceived by people who are skilled in the art and those that are substantially the same. Furthermore, the structures described below can be combined as appropriate. In addition, various omissions, substitutions, or changes of the structures can be made without departing from the gist of the present invention.

Figure 1:
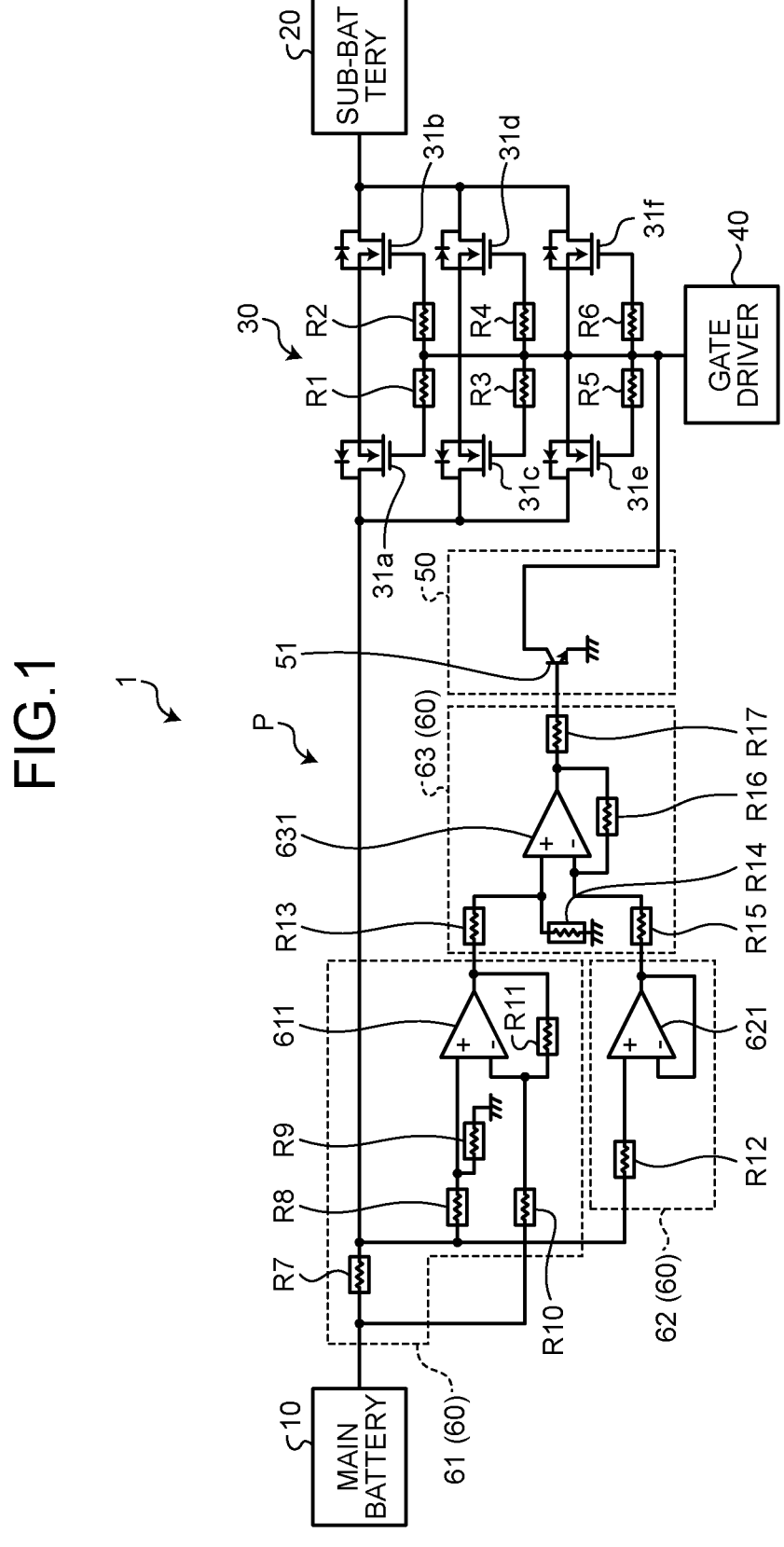
FIG. 1 is a circuit diagram illustrating a structure example of a power supply device according to an embodiment.

A power supply device 1 according to an embodiment will be described with reference to the drawings. The power supply device 1 is mounted on a vehicle and supplies power to a load unit of the vehicle. For example, the power supply device 1 determines an electrical connection error such as a short circuit or ground fault (leakage current) in a power circuit P and interrupts a power supply path. As illustrated in FIG. 1, the power supply device 1 includes the power circuit P, a main battery 10 as a first electrical device, a sub-battery 20 as a second electrical device, an interruption circuit 30, a gate driver 40, a gate driver control unit 50, and a short-circuit determination circuit 60. The power circuit P is provided across the main battery 10 and the sub-battery 20.

The main battery 10 is a storage battery capable of charging and supplying power and is, for example, a lead-acid battery or a lithium-ion battery. The main battery 10 supplies power to the load unit mounted on the vehicle. The main battery 10 is connected to the sub-battery 20 via the interruption circuit 30 to charge the sub-battery 20.

The sub-battery 20 is a storage battery capable of charging and supplying power and is, for example, a lead-acid battery or a lithium-ion battery. The sub-battery 20 supplies power to the load unit mounted on the vehicle. The sub-battery 20 is connected to the main battery 10 via the interruption circuit 30 and charges the power supplied from the main battery 10.

The interruption circuit 30 interrupts the current and is, for example, a back-to-back circuit. The interruption circuit 30 includes a pair of FETs 31a and 31b, a pair of FETs 31c and 31d, a pair of FETs 31e and 31f, and resistors R1 to R6. These FETs 31a to 31f are, for example, N-channel MOS-FETs. Each pair of the three pairs of FETs are connected in parallel.

Specifically, the pair of FETs 31a and 31b have their source terminals connected to each other. The FET 31a has a drain terminal thereof connected to the main battery 10 and has a gate terminal thereof connected to the gate driver 40 via the resistor R1. The FET 31b has a drain terminal thereof connected to the sub-battery 20 and has a gate terminal thereof connected to the gate driver 40 via the resistor R2. The pair of FETs 31a and 31b are turned on when voltage is applied to the gate terminals, thereby allowing bidirectional current conduction between the main battery 10 and the sub-battery 20, and turned off when voltage is not applied to the gate terminals, thereby interrupting the bidirectional current conduction between the main battery 10 and the sub-battery 20.

The pair of FETs 31c and 31d have their source terminals connected to each other. The FET 31c has a drain terminal thereof connected to the main battery 10 and has a gate terminal thereof connected to the gate driver 40 via the resistor R3. The FET 31d has a drain terminal thereof connected to the sub-battery 20, and has a gate terminal thereof connected to the gate driver 40 via the resistor R4. The pair of FETs 31c and 31d are turned on when voltage is applied to the gate terminals, thereby allowing bidirectional current conduction between the main battery 10 and the sub-battery 20, and are turned off when voltage is not applied to the gate terminals, thereby interrupting the bidirectional current conduction between the main battery 10 and the sub-battery 20.

The pair of FETs 31e and 31f have their source terminals connected to each other. The FET 31e has a drain terminal thereof connected to the main battery 10, and has a gate terminal thereof connected to the gate driver 40 via the resistor R5. The FET 31f has a drain terminal thereof connected to the sub-battery 20, and has a gate terminal thereof connected to the gate driver 40 via the resistor R6. The pair of FETs 31e and 31f are turned on when voltage is applied to the gate terminals, thereby allowing bidirectional current conduction between the main battery 10 and the sub-battery 20, and turned off when voltage is not applied to the gate terminals, thereby interrupting the bidirectional current conduction between the main battery 10 and the sub-battery 20.

The gate driver 40 controls the interruption circuit 30. The gate driver 40 is connected to the gate terminals of the FETs 31a to 31f of the interruption circuit 30, and turns on the FETs 31a to 31f by applying voltage to the gate terminals and turns off the FETs 31a to 31f by stopping the application of voltage to the gate terminals.

The gate driver control unit 50 controls the gate driver 40 in accordance with commands from the short-circuit determination circuit 60. The gate driver control unit 50 includes a transistor 51. The transistor 51 is, for example, an npn-type bipolar transistor, with a collector terminal thereof connected between the gate driver 40 and the gate terminals of the FETs 31a to 31f, an emitter terminal thereof connected to the ground, and a base terminal thereof connected to the short-circuit determination circuit 60. When the transistor 51 is turned on by voltage application from the short-circuit determination circuit 60, a collector current (current output from the gate driver 40) flows from the collector terminal to the emitter terminal, thereby stopping the voltage application to each gate terminal by the gate driver 40. Therefore, the transistor 51 can turn off the FETs 31a to 31f. On the other hand, when the transistor 51 is turned off with no voltage application by the short-circuit determination circuit 60, no collector current flows from the collector terminal to the emitter terminal, thereby continuing the voltage application to each gate terminal by the gate driver 40. Therefore, the transistor 51 can keep the FETs 31a to 31f on.

The short-circuit determination circuit 60 determines electrical connection errors such as a short circuit and a ground fault. The short-circuit determination circuit 60, for example, interrupts the interruption circuit 30 upon determining that the main battery 10 has a ground fault. The short-circuit determination circuit 60 includes a current detection unit 61, a voltage detection unit 62, and a short-circuit determination unit 63.

The current detection unit 61 detects current, and in this example, detects the current flowing between the main battery 10 and the sub-battery 20. The current detection unit 61 includes a shunt resistor R7, a current amplifier circuit 611, and resistors R8 to R11.

The shunt resistor R7 is provided between the main battery 10 and the sub-battery 20, and has one end thereof connected to the main battery 10 and the other end thereof connected to the sub-battery 20.

The current amplifier circuit 611 amplifies current. The current amplifier circuit 611 includes a non-inverting input terminal (+), an inverting input terminal (−), and an output terminal. The non-inverting input terminal (+) is connected between the sub-battery 20 and the shunt resistor R7 via the resistor R8. The inverting input terminal (−) is connected between the shunt resistor R7 and the main battery 10 via the resistor R10 and connected to the output terminal via the resistor R11. The output terminal is connected to the short-circuit determination unit 63. The resistor R9 has one end thereof connected between the resistor R8 and the non-inverting input terminal (+) and the other end thereof connected to the ground. The resistor R9 divides the voltage to be applied to the shunt resistor R7. The amplification factor of the current amplifier circuit 611 is determined based on the ratio between the resistance of the resistor R10 and the resistance of the resistor R11. The current amplifier circuit 611 outputs a voltage value (detection value) resulting from amplification of voltage applied to the shunt resistor R7 to the short-circuit determination unit 63.

The voltage detection unit 62 detects voltage, and in this example, detects the voltage applied between the main battery 10 and the sub-battery 20. The voltage detection unit 62 includes a voltage conversion circuit 621 and a resistor R12.

The voltage conversion circuit 621 converts voltage. The voltage conversion circuit 621, for example, forms a voltage follower circuit and includes a non-inverting input terminal (+), an inverting input terminal (−), and an output terminal. The non-inverting input terminal (+) is connected between the main battery 10 and the sub-battery 20 via the resistor R12. The non-inverting input terminal (+) is connected, for example, between the shunt resistor R7 and the sub-battery 20. The inverting input terminal (−) is connected to the output terminal. The output terminal is connected to the short-circuit determination unit 63. The voltage conversion circuit 621 outputs the voltage value (detection value) of the power supply voltage applied between the main battery 10 and the sub-battery 20 to the short-circuit determination unit 63. The voltage follower circuit may be unnecessary depending on the structure of the short-circuit determination unit 63 in the subsequent stage.

The short-circuit determination unit 63 determines electrical connection errors such as a short circuit and a ground fault. The short-circuit determination unit 63 determines a short circuit in the power circuit P on the basis of the difference between the detection value (voltage value) of the current detected by the current detection unit 61 and the detection value (voltage value) of the voltage detected by the voltage detection unit 62. When the difference between the detection value of the current detected by the current detection unit 61 and the detection value of the voltage detected by the voltage detection unit 62 is more than or equal to a predetermined threshold Th (see FIG. 4), the short-circuit determination unit 63, for example, determines a short circuit (detects a short circuit) and interrupts the interruption circuit 30 via the gate driver control unit 50. On the other hand, when the difference between the detection value of the current detected by the current detection unit 61 and the detection value of the voltage detected by the voltage detection unit 62 is less than the threshold Th, the short-circuit determination unit 63 does not determine a short circuit (does not detect a short circuit) and does not interrupt the interruption circuit 30 via the gate driver control unit 50. The short-circuit determination unit 63 includes a differential amplifier circuit 631 and resistors R13 to R17.

The differential amplifier circuit 631 amplifies a differential voltage. The differential amplifier circuit 631 includes a non-inverting input terminal (+), an inverting input terminal (−), and an output terminal. The non-inverting input terminal (+) is connected to the output terminal of the current amplifier circuit 611 via the resistor R13. The inverting input terminal (−) is connected to the output terminal of the voltage conversion circuit 621 via the resistor R15 and to the output terminal of the differential amplifier circuit 631 via the resistor R16. The output terminal of the differential amplifier circuit 631 is connected to the gate driver control unit 50 via the resistor R17. The resistor R14 has one end thereof connected between the resistor R13 and the non-inverting input terminal (+) and the other end thereof connected to the ground. The resistor R14 divides the voltage output from the output terminal of the current amplifier circuit 611. The amplification factor of the differential amplifier circuit 631 is determined based on the ratio between the resistance of the resistor R15 and the resistance of the resistor R16.

Figure 2:
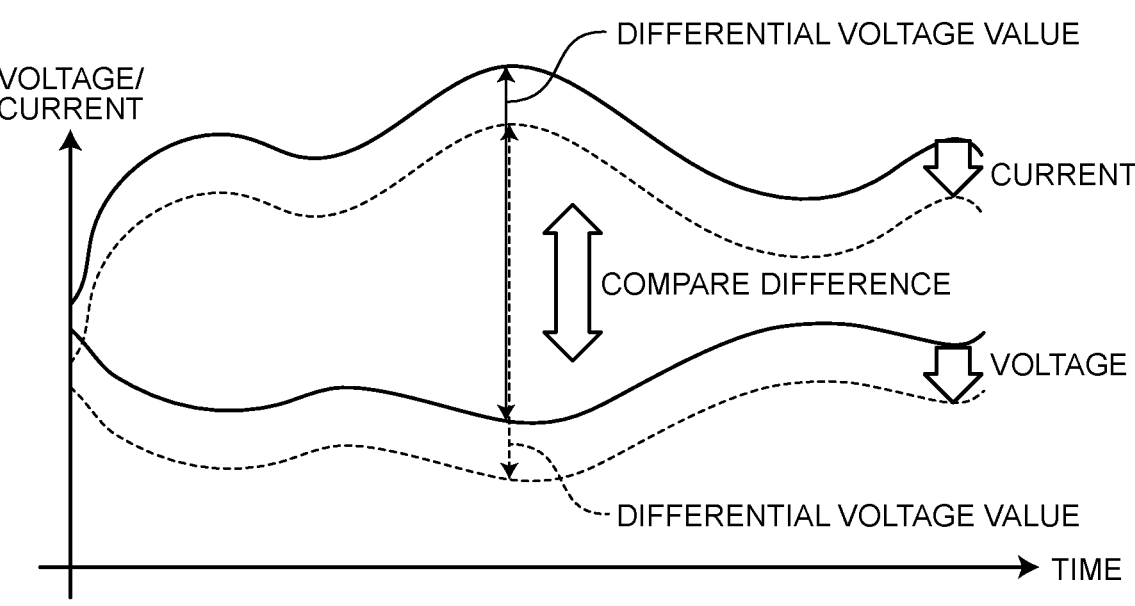
FIG. 2 is a diagram expressing a difference between current and voltage in the embodiment.

In a case where a differential voltage value resulting from amplification of a difference between the voltage value of the current output from the current amplifier circuit 611 and the voltage value of the voltage output from the voltage conversion circuit 621 is more than or equal to the threshold Th, that is, upon detection of a ground fault or the like, the differential amplifier circuit 631 outputs an interruption signal to the interruption circuit 30 via the gate driver control unit 50, thereby interrupting the interruption circuit 30. The differential amplifier circuit 631, for example, turns on the transistor 51 by applying a predetermined voltage (differential voltage of more than or equal to the threshold Th) from the output terminal to the base terminal of the transistor 51 of the gate driver control unit 50 as an interruption signal, thereby interrupting the interruption circuit 30. On the other hand, in a case where the differential voltage value resulting from the amplification of the difference between the voltage value of the current output from the current amplifier circuit 611 and the voltage value of the voltage output from the voltage conversion circuit 621 is less than the threshold Th, that is, if a ground fault or the like is not detected, the differential amplifier circuit 631 does not output the interruption signal to the interruption circuit 30 via the gate driver control unit 50 and does not interrupt the interruption circuit 30. The differential amplifier circuit 631, for example, turns off the transistor 51 by not applying the predetermined voltage (differential voltage of more than or equal to the threshold Th) from the output terminal to the base terminal of the transistor 51 of the gate driver control unit 50, thereby keeping the current conduction state of the interruption circuit 30. The differential voltage value is the voltage value resulting from the amplification of the difference between the voltage value of the current output from the current amplifier circuit 611 and the voltage value of the voltage output from the voltage conversion circuit 621, and for example, as illustrated in FIG. 2, even if the current and voltage change, the relative differential voltage value between the voltage value of the current and the voltage value of the voltage does not change.

Figure 3:
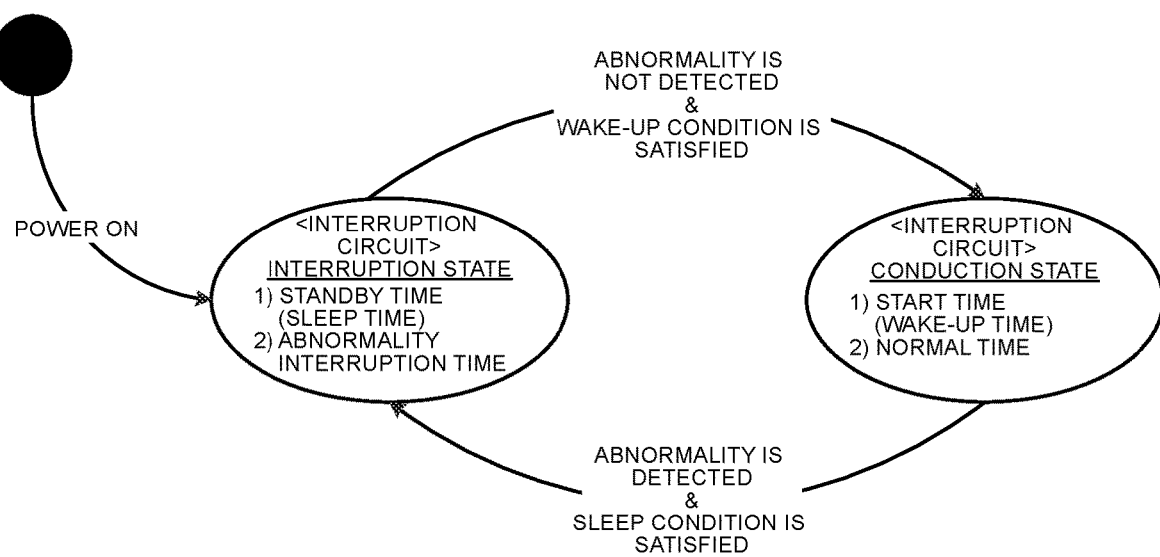
FIG. 3 is a diagram expressing state transitions of an interruption circuit according to the embodiment.

Next, the state transition of the power supply device 1 with the structure as described above will be explained. The power supply device 1, for example, causes the interruption circuit 30 to transit to the interruption state when power is turned on, as illustrated in FIG. 3. In a case where the short-circuit determination circuit 60 does not detect an error such as a ground fault and a wake-up condition that starts the power supply device 1 is satisfied when power is turned on, the power supply device 1 causes the interruption circuit 30 to transit to the current conduction state. In a case where an error such as a ground fault is detected by the short-circuit determination circuit 60 and a sleep condition that makes the power supply device 1 standby is satisfied after the interruption circuit 30 transits to the current conduction state, the power supply device 1 causes the interruption circuit 30 to transit to the interruption state. Thus, the state of the power supply device 1 transits from the power-on state.

Figure 4:
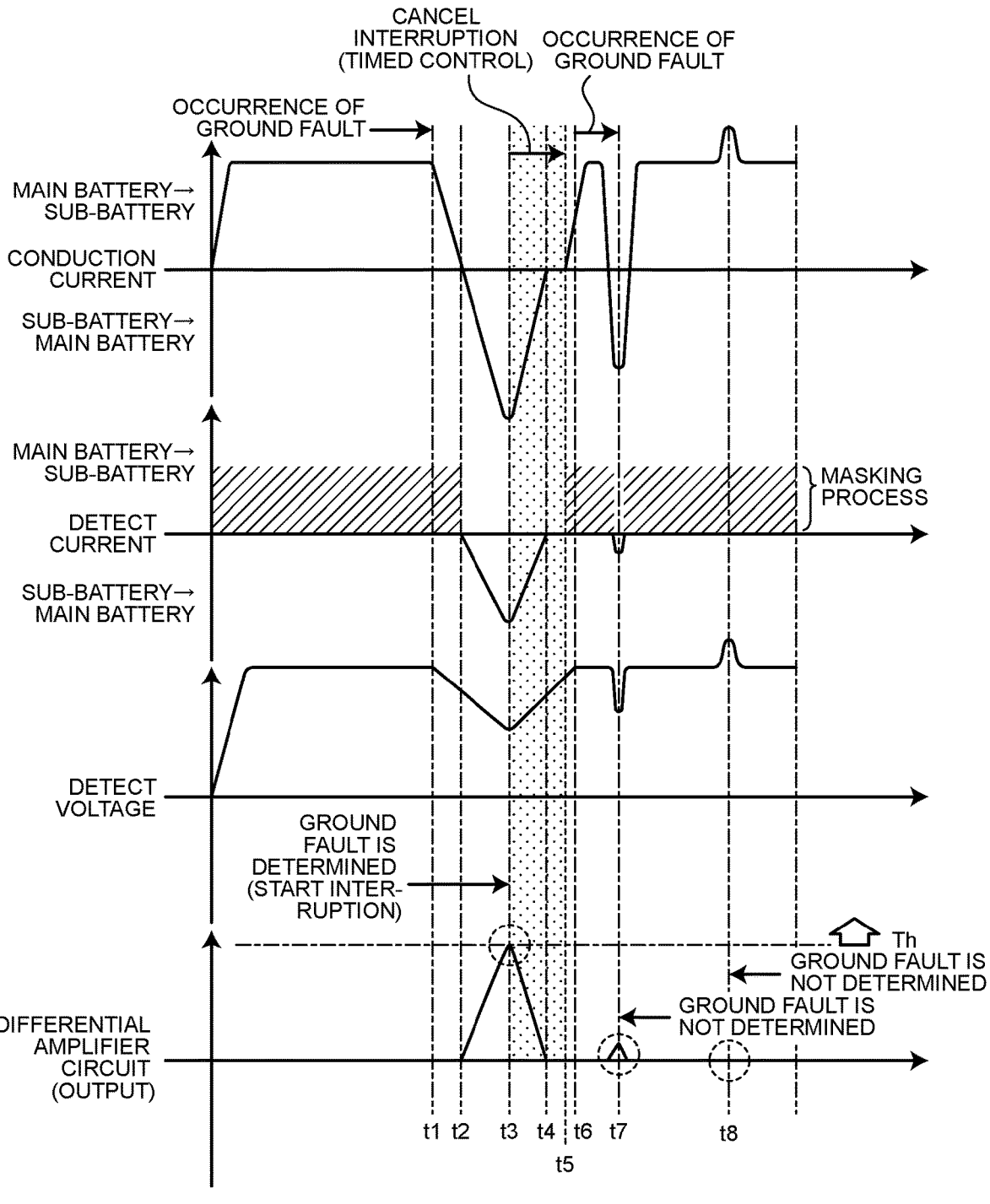
FIG. 4 is a diagram expressing an example of an operation of a short-circuit determination circuit according to the embodiment.

Next, an example of the operation of the power supply device 1 is described. In this example, it is assumed that current flows from the main battery 10 to the sub-battery 20 under normal conditions in the power supply device 1. In the power supply device 1, as illustrated in FIG. 4, for example, when a ground fault occurs in the main battery 10 (time t1), the voltage value of the voltage detected by the voltage conversion circuit 621 decreases (time t1). After that, the current flows reversely from the sub-battery 20 to the main battery 10 (time t2). At this time, the current amplifier circuit 611 detects the current flowing from the sub-battery 20 to the main battery 10 and outputs the voltage value of the detected current to the differential amplifier circuit 631 of the short-circuit determination unit 63 (time t2). In a case where the differential voltage value resulting from the amplification of the difference between the voltage value of the current output from the current amplifier circuit 611 and the voltage value of the voltage output from the voltage conversion circuit 621 is more than or equal to the threshold Th (time t3), the differential amplifier circuit 631 determines that a short circuit (ground fault) has occurred and outputs an interruption signal (differential voltage of more than or equal to threshold Th) so as to turn on the transistor 51 in the gate driver control unit 50, thereby interrupting the interruption circuit 30 (time t3). The gate driver control unit 50 includes a latch circuit (not illustrated). When an interruption signal is output from the differential amplifier circuit 631, the latch circuit keeps the transistor 51 on until a predetermined time elapses, maintaining the interruption state of the interruption circuit 30 (timed control: time t3 to time t5). Note that, at the time t4, the voltage value of the current output from the current amplifier circuit 611 is zero, and the reverse current flow has stopped. When the predetermined time has elapsed after the interruption of the interruption circuit 30, the gate driver control unit 50 cancels the interruption of the interruption circuit 30 and conducts current to the interruption circuit 30 (time t5). After the current conduction state is obtained, at the time t6, the voltage value of the voltage detected by the voltage conversion circuit 621 has recovered to the voltage in the current conduction state.

After that, in a case where the current flows reversely from the sub-battery 20 to the main battery 10 at the occurrence of a ground fault in the main battery 10 again (time t7), the differential amplifier circuit 631 determines whether the differential voltage value resulting from the amplification of the difference between the voltage value of the current output from the current amplifier circuit 611 and the voltage value of the voltage output from the voltage conversion circuit 621 is more than or equal to the threshold Th. The differential amplifier circuit 631 does not interrupt the interruption circuit 30 via the gate driver control unit 50 when the differential voltage value is less than the threshold Th (time t7). When an overcurrent flows from the main battery 10 to the sub-battery 20, the current amplifier circuit 611 does not detect the flow of the overcurrent by masking with a mask circuit (not illustrated) (time t8). As a result, the differential amplifier circuit 631 does not interrupt the interruption circuit 30 via the gate driver control unit 50 because the differential voltage value is less than the threshold Th (time t8). Note that the mask circuit disables (masks) the current detected by the current detection unit 61 when current flows from the main battery 10 to the sub-battery 20.

Figure 5:
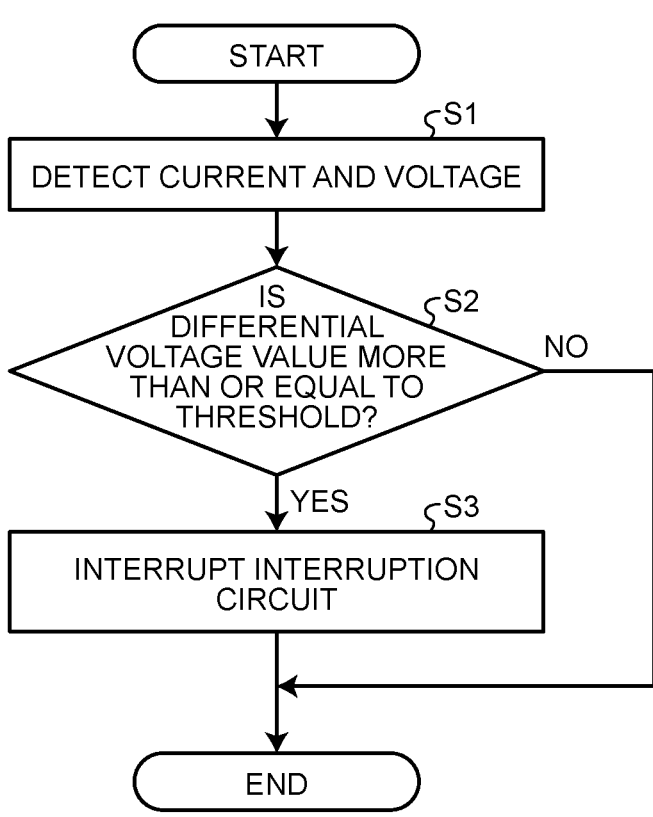
FIG. 5 is a flowchart expressing an example of the operation of the short-circuit determination circuit according to the embodiment.

Next, an example of the operation of the short-circuit determination circuit 60 is described with reference to the flowchart. As illustrated in FIG. 5, in the short-circuit determination circuit 60, the current detection unit 61 detects the current flowing between the main battery 10 and the sub-battery 20 and the voltage detection unit 62 detects the voltage applied between the main battery 10 and the sub-battery 20 (step S1). If the difference between the voltage value of the current detected by the current detection unit 61 and the detection value of the voltage detected by the voltage detection unit 62 is more than or equal to the threshold Th (Yes at step S2), the short-circuit determination unit 63 determines a short circuit has occurred and interrupts the interruption circuit 30 via the gate driver control unit 50 (step S3). On the other hand, if the difference between the voltage value of the current detected by the current detection unit 61 and the detection value of the voltage detected by the voltage detection unit 62 is less than the threshold Th (No at step S2), the short-circuit determination unit 63 does not determine a short circuit has occurred and does not interrupt the interruption circuit 30 via the gate driver control unit 50.

As described above, the short-circuit determination circuit 60 in the embodiment includes the current detection unit 61, the voltage detection unit 62, and the short-circuit determination unit 63. The current detection unit 61 detects the current flowing in the power circuit P. The voltage detection unit 62 detects the voltage applied to the power circuit P. The short-circuit determination unit 63 determines a short circuit in the power circuit P on the basis of the difference between the detection value of the current detected by the current detection unit 61 and the detection value of the voltage detected by the voltage detection unit 62.

With this configuration, the short-circuit determination circuit 60 determines a short circuit on the basis of the above-described differential voltage value, so that noise generated in the current and voltage can be cancelled, which allows accurate determination of the short circuit without the need of a filter circuit to remove noise. Since the short-circuit determination circuit 60 determines a short circuit on the basis of the differential voltage value described above, the time from the occurrence of a short circuit to the determination of the short circuit can be shortened compared to the case where a voltage abnormality is determined based on the inclination of the voltage with respect to time change, for example. As a result, the short-circuit determination circuit 60 can properly determine a short circuit.

In the short-circuit determination circuit 60, the power circuit P is provided across the main battery 10 and the sub-battery 20. The sub-battery 20 is connected to the main battery 10 via the interruption circuit 30. The current detection unit 61 detects the current flowing between the main battery 10 and the sub-battery 20. The voltage detection unit 62 detects the voltage applied between the main battery 10 and the sub-battery 20. When the difference between the detection value of the current detected by the current detection unit 61 and the detection value of the voltage detected by the voltage detection unit 62 is more than or equal to the predetermined threshold Th, the short-circuit determination unit 63 determines a short circuit has occurred and interrupts the interruption circuit 30. With this configuration, the short-circuit determination circuit 60 can properly determine a short circuit or the like between the main battery 10 and the sub-battery 20 and execute the interruption process.

In the short-circuit determination circuit 60, the current detection unit 61 includes the current amplifier circuit 611 that amplifies the current and the shunt resistor R7. The voltage detection unit 62 includes the voltage conversion circuit 621 that amplifies the voltage. The short-circuit determination unit 63 includes the differential amplifier circuit 631 that amplifies the differential voltage. The shunt resistor R7 is provided between the main battery 10 and the sub-battery 20. The current amplifier circuit 611 outputs the voltage value resulting from the amplification of the voltage applied to the shunt resistor R7 to the differential amplifier circuit 631 as the detection value of the current. The voltage conversion circuit 621 outputs the voltage value resulting from the conversion of the voltage applied between the main battery 10 and the sub-battery 20 to the differential amplifier circuit 631 as the detection value of the voltage. When the differential voltage value resulting from the amplification of the difference between the voltage value of the current output from the current amplifier circuit 611 and the voltage value of the voltage output from the voltage conversion circuit 621 is more than or equal to the threshold Th, the differential amplifier circuit 631 outputs an interruption signal to the interruption circuit 30 so as to interrupt the interruption circuit 30. With this configuration, the short-circuit determination circuit 60 can properly determine a short circuit or the like between the main battery 10 and the sub-battery 20 using an analog circuit such as the current amplifier circuit 611.

In the example described above, the short-circuit determination circuit 60 uses the analog circuit such as the current amplifier circuit 611; however, the present embodiment is not limited to this example and a digital circuit may be used in another example.

In the example described above, the first electrical device is the main battery 10 and the second electrical device is the sub-battery 20; however, the present embodiment is not limited to this example and the first electrical device and the second electrical device may be other electrical devices.

In the example described above, the current detection unit 61 detects the current value by using the shunt resistor R7 and the current amplifier circuit 611; however, the present embodiment is not limited to this example and the current value may be detected based on the magnetic field generated by the current.

In the example described above, when the differential voltage value resulting from the amplification of the difference between the voltage value of the current output from the current amplifier circuit 611 and the voltage value of the voltage output from the voltage conversion circuit 621 is more than or equal to the threshold Th, the short-circuit determination unit 63 applies the differential voltage of more than or equal to the threshold Th to turn on the transistor 51 in the gate driver control unit 50, thereby interrupting the interruption circuit 30. However, the present embodiment is not limited to this example. In another example, the short-circuit determination unit 63 may compare the differential voltage value resulting from the amplification of the difference between the voltage value of the current output from the current amplifier circuit 611 and the voltage value of the voltage output from the voltage conversion circuit 621 with the threshold Th and if the differential voltage value is more than or equal to the threshold Th, the short-circuit determination unit 63 may determine that a short circuit has occurred, and output the interruption signal to turn on the transistor 51 to the gate driver control unit 50, thereby interrupting the interruption circuit 30.

The power supply device 1 illustrated in FIG. 1 is a circuit for detecting a ground fault that occurs on the main battery 10 side (conduction current in FIG. 4: sub-battery to main battery). However, the present embodiment is not limited to this example. The power supply device 1 can also detect ground faults on the sub-battery 20 side, for example, by reversing the polarity of the current amplifier circuit (OP amplifier) 611 of the current detection unit 61. Thus, the current detecting direction of the power supply device 1 is not limited. In the example described above, the power supply device 1 detects a ground fault on the main battery 10 side, and the current in FIG. 4 (conduction current: main battery to sub-battery) is not detected.

In the example described above, the voltage conversion circuit 621 forms the voltage follower circuit; however, the present embodiment is not limited to this example. The voltage conversion circuit 621 may be, for example, a voltage amplifier circuit that amplifies voltage by controlling the voltage adjustment of the current amplifier circuit 611 and the differential amplifier circuit 631, or a voltage divider circuit with a resistor.

Since the short-circuit determination circuit according to the present embodiment determines a short circuit on the basis of the differential voltage value, noise generated in the current and voltage can be cancelled, which allows accurate determination of the short circuit without the need of a filter circuit to remove noise. In addition, since the short-circuit determination circuit determines a short circuit on the basis of the differential voltage value, the time from the occurrence of a short circuit to the determination of the short circuit can be shortened compared to the case where a voltage abnormality is determined based on the inclination of the voltage with respect to time change, for example. As a result, the short-circuit determination circuit can properly determine a short circuit.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A short-circuit determination circuit comprising:
a current detection unit that detects current flowing in a power circuit and outputs a first value that represents a detected current flowing in the power circuit;
a voltage detection unit that detects voltage applied to the power circuit and outputs a second value that represents a detected voltage applied to the power circuit; and
a short-circuit determination unit that determines a short circuit in the power circuit based on a difference between the first value and the second value.

2. The short-circuit determination circuit according to claim 1, wherein
the power circuit is provided across a first electrical device and a second electrical device, the first electrical device is a main battery capable of supplying power,
the second electrical device is a sub-battery connected to the main battery via an interruption circuit and being capable of supplying power,
the current detection unit detects current flowing between the main battery and the sub-battery, the first value represents the current flowing between the main battery and the sub-battery,
the voltage detection unit detects voltage applied between the main battery and the sub-battery, the second value represents the voltage applied between the main battery and the sub-battery, and
when a difference between the first value and the second value is more than or equal to a predetermined threshold, the short-circuit determination unit determines a short circuit has occurred and interrupts the interruption circuit.

3. The short-circuit determination circuit according to claim 2, wherein
the current detection unit includes a shunt resistor and a current amplifier circuit that amplifies a voltage applied to the shunt resistor,
the voltage detection unit includes a voltage conversion circuit that converts voltage,
the short-circuit determination unit includes a differential amplifier circuit that amplifies a differential voltage value,
the shunt resistor is provided between the main battery and the sub-battery,
the current amplifier circuit obtains the first value by amplifying the voltage applied to the shunt resistor and outputs the first value to the differential amplifier circuit,
the voltage conversion circuit obtains the second value by converting the voltage applied between the main battery and the sub-battery and outputs the second value to the differential amplifier circuit,
the short-circuit determination unit obtains the differential voltage by amplifying the difference between the first value and the second value, and
when the differential voltage value is more than or equal to the threshold, the differential amplifier circuit outputs an interruption signal to the interruption circuit to interrupt the interruption circuit.

4. The short-circuit determination circuit according to claim 3, further comprising:
a plurality of first transistors connected between the main battery and the sub-battery and configured to:
allow bidirectional current conduction between the main battery and the sub-battery when the first transistors are turned on; and
interrupt the bidirectional current conduction between the main battery and the sub-battery when the first transistors are turned off.

5. The short-circuit determination circuit according to claim 4, further comprising:
a driver connected to each of the first transistors and configured to output a signal to each of the first transistors to selectively turn on and turn off each of the first transistors; and
a second transistor receiving the differential voltage value from the short-circuit determination unit and configured to:

turn on and cause the signal emitted by the driver to bypass all of the first transistors when the differential voltage value is more than or equal to the threshold; and turn off and permit the signal emitted by the driver to be transmitted to each of the first transistors when the differential voltage value is less than the threshold.

\* \* \* \* \*